(12) United States Patent
Fried et al.

(10) Patent No.: US 6,624,651 B1
(45) Date of Patent: Sep. 23, 2003

(54) KERF CIRCUIT FOR MODELING OF BEOL CAPACITANCES

(75) Inventors: David M. Fried, Williston, VT (US); Peter A. Habitz, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 297 days.

(21) Appl. No.: 09/684,849

(22) Filed: Oct. 6, 2000

(51) Int. Cl.[7] .................. G01R 31/26; G01R 31/02; G01R 1/04
(52) U.S. Cl. .................. 324/765; 324/763; 324/158.1
(58) Field of Search .................. 324/763, 765, 324/719, 158.1; 714/733, 734; 257/48

(56) References Cited

U.S. PATENT DOCUMENTS

| | | | |
|---|---|---|---|
| 3,781,683 A | * 12/1973 | Freed | .................. 324/765 |
| 3,849,872 A | * 11/1974 | Hubacher | .................. 324/158.1 |
| 4,244,048 A | 1/1981 | Tsui | |
| 4,439,727 A | * 3/1984 | Boyle | .................. 324/763 |
| 5,313,158 A | 5/1994 | Joosten et al. | |
| 5,449,948 A | * 9/1995 | Inoue et al. | .................. 257/531 |
| 5,761,076 A | 6/1998 | Miki | |
| 5,825,673 A | 10/1998 | Watanabe | |
| 5,825,785 A | 10/1998 | Barry et al. | |
| 5,899,703 A | 5/1999 | Kalter et al. | |
| 5,901,063 A | 5/1999 | Chang et al. | |
| 6,265,889 B1 | * 7/2001 | Tomita et al. | .................. 324/765 |
| 6,300,765 B1 | * 10/2001 | Chen | .................. 324/158.1 |
| 6,404,217 B1 | * 6/2002 | Gordon | .................. 324/158.1 |

\* cited by examiner

Primary Examiner—Kamand Cuneo
Assistant Examiner—Jermele M. Hollington
(74) Attorney, Agent, or Firm—Schmeiser, Olsen & Watts; Mark F. Chadurjian

(57) ABSTRACT

A kerf circuit for modeling of Back End Of Line (BEOL) capacitances is disclosed. The kerf circuit contains a clock circuit connected to a number of capacitance testing circuits. Each capacitance testing circuit acts a "bay" that can be configured to test one particular capacitance. The clock circuit allows the capacitance testing circuits to charge and discharge the capacitive structures being tested. By having a number of different capacitance testing circuits, capacitances of many different structures may be tested at one time. This is particularly true if the kerf circuit is repeated several or many times, with each different kerf circuit containing different capacitive testing circuits that themselves contain different capacitive structures. The kerf circuit interfaces to testing equipment through pads. The pads connect to each capacitive testing circuit and allow capacitance measurements to be performed by measuring current.

29 Claims, 20 Drawing Sheets

| Sub-Macro | Pad # | Pad Name | BEOL Structure Node TBM | BEOL Structure Ground Node |
|---|---|---|---|---|
| A | 1 | EN1 | Enable Ring for Legs 1 - 5 | - |
| A | 2 | FD1 | Double Frequency for Legs 1 - 5 | - |
| A | 3 | Ref1 | 10 x .24 μm M1 Line | None |
| A | 4 | Test1 | 30 x .24 μm M1 Line | None |
| A | 5 | Ref 2 | 10 x .28 μm M2 Line | None |
| A | 6 | Test 2 | 30 x .28 μm M2 Line | None |
| A | 7 | Ref 3 | 10 x .28 μm M3 Line | None |
| A | 8 | Test 3 | 30 x .28 μm M3 Line | None |
| A | 9 | Ref 4 | 10 x .28 μm M4 Line | None |
| A | 10 | Test 4 | 30 x .28 μm M4 Line | None |
| A | 11 | Ref 5 | 30 x .28 μm M1 Line | None |
| A | 12 | Test 5 | 30 x .28 μm M1 Line | None |
| A | 13 | Vdd | Sub-Macro Vdd | - |

FIG. 6

| Sub-Macro | Pad # | Pad Name | BEOL Structure Node TBM | BEOL Structure Ground Node |
|---|---|---|---|---|
| A | 14 | Gnd | Sub-Macro Gnd | - |
| A | 15 | Ref 6 | 10 x .48 μm M1 Line | None |
| A | 16 | Test 6 | 30 x .48 μm M1 Line | None |
| A | 17 | Ref 7 | 10 x .56 μm M2 Line | None |
| A | 18 | Test 7 | 30 x .56 μm M2 Line | None |
| A | 19 | Ref 8 | 10 x .56 μm M3 Line | None |
| A | 20 | Test 8 | 30 x .56 μm M3 Line | None |
| A | 21 | Ref 9 | 10 x .56 μm M4 Line | None |
| A | 22 | Test 9 | 30 x .56 μm M4 Line | None |
| A | 23 | CLKOUT | Bottom 4 Legs Clock Signal Out | - |
| A | 24 | FD2 | Double Frequency for Legs 6 - 9 | - |
| A | 25 | EN2 | Enable Ring for Legs 6 - 9 | - |

FIG. 7

| Sub-Macro | Pad # | Pad Name | BEOL Structure Node TBM | BEOL Structure Ground Node |
|---|---|---|---|---|
| C | 1 | EN1 | Enable Ring for Legs 1 - 5 | - |
| C | 2 | FD1 | Double Frequency for Legs 1 - 5 | - |
| C | 3 | Ref1 | 10f x 20 x .28 µm M1  S=.84 µm | None |
| C | 4 | Test1 | 10f x 20 x .28 µm M1  S=.84 µm | Same Comb Interleaved |
| C | 5 | Ref 2 | 10f x 20 x .28 µm M2  S=.84 µm | None |
| C | 6 | Test 2 | 10f x 20 x .28 µm M2  S=.84 µm | Same Comb Interleaved |
| C | 7 | Ref 3 | 10f x 20 x .28 µm M3  S=.84 µm | None |
| C | 8 | Test 3 | 10f x 20 x .28 µm M3  S=.84 µm | Same Comb Interleaved |
| C | 9 | Ref 4 | 10f x 20 x .28 µm M4  S=.84 µm | None |
| C | 10 | Test 4 | 10f x 20 x .28 µm M4  S=.84 µm | Same Comb Interleaved |
| C | 11 | Ref 5 | 10f x 20 x .28 µm M1  S=.84 µm | None |
| C | 12 | Test 5 | 10f x 20 x .28 µm M1  S=.84 µm | None |
| C | 13 | Vdd | Sub-Macro Vdd | - |

FIG. 8

| Sub-Macro | Pad # | Pad Name | BEOL Structure Node TBM | BEOL Structure Node Ground Node |
|---|---|---|---|---|
| C | 14 | Gnd | Sub-Macro Gnd | - |
| C | 15 | Ref 6 | 10f x 20 x .28 μm M1  S=1.4 μm | None |
| C | 16 | Test 6 | 10f x 20 x .28 μm M1  S=1.4 μm | Same Comb Interleaved |
| C | 17 | Ref 7 | 10f x 20 x .28 μm M2  S=1.4 μm | None |
| C | 18 | Test 7 | 10f x 20 x .28 μm M2  S=1.4 μm | Same Comb Interleaved |
| C | 19 | Ref 8 | 10f x 20 x .28 μm M3  S=1.4 μm | None |
| C | 20 | Test 8 | 10f x 20 x .28 μm M3  S=1.4 μm | Same Comb Interleaved |
| C | 21 | Ref 9 | 10f x 20 x .28 μm M4  S=1.4 μm | None |
| C | 22 | Test 9 | 10f x 20 x .28 μm M4  S=1.4 μm | Same Comb Interleaved |
| C | 23 | CLKOUT | Bottom 4 Legs Clock Signal Out | - |
| C | 24 | FD2 | Double Frequency for Legs 6 - 9 | - |
| C | 25 | EN2 | Enable Ring for Legs 6 - 9 | - |

FIG. 9

| Sub-Macro | Pad # | Pad Name | BEOL Structure Node TBM | BEOL Structure Ground Node |
|---|---|---|---|---|
| D | 1 | EN1 | Enable Ring for Legs 1 - 5 | - |
| D | 2 | FD1 | Double Frequency for Legs 1 - 5 | - |
| D | 3 | Ref1 | 30 x .24μm M1 line | None |
| D | 4 | Test1 | 30 x .24μm M1 line | 20 x .28μm M2 Line VC |
| D | 5 | Ref 2 | 30 x .24μm M1 line | None |
| D | 6 | Test 2 | 30 x .24μm M1 line | 20 x .28μm M3 Line VC |
| D | 7 | Ref 3 | 30 x .24μm M1 line | None |
| D | 8 | Test 3 | 30 x .24μm M1 line | 20 x .28μm M4 Line VC |
| D | 9 | Ref 4 | 30 x .24μm M1 line | None |
| D | 10 | Test 4 | 30 x .24μm M1 line | None |
| D | 11 | Ref 5 | 30 x .28μm M2 line | None |
| D | 12 | Test 5 | 30 x .28μm M2 line | 20 x .28μm M3 Line VC |
| D | 13 | Vdd | Sub-Macro Vdd | - |

FIG. 10

| Sub-Macro | Pad # | Pad Name | BEOL Structure Node TBM | BEOL Structure Ground Node |
|---|---|---|---|---|
| D | 14 | Gnd | Sub-Macro Gnd | - |
| D | 15 | Ref 6 | 30 x .28 µm M2 line | None |
| D | 16 | Test 6 | 30 x .28 µm M2 line | 20 x .28µm M4 Line VC |
| D | 17 | Ref 7 | 30 x .28 µm M3 line | None |
| D | 18 | Test 7 | 30 x .28 µm M3 line | 20 x .28µm M4 Line VC |
| D | 19 | Ref 8 | 30 x .28 µm M3 line | None |
| D | 20 | Test 8 | 30 x .28 µm M3 line | 20 x .28µm M5 Line VC |
| D | 21 | Ref 9 | 30 x .28 µm M4 line | None |
| D | 22 | Test 9 | 30 x .28 µm M4 line | 20 x .28µm M5 Line VC |
| D | 23 | CLKOUT | Bottom 4 Legs Clock Signal Out | - |
| D | 24 | FD2 | Double Frequency for Legs 6 - 9 | - |
| D | 25 | EN2 | Enable Ring for Legs 6 - 9 | - |

FIG. 11

| Sub-Macro | Pad # | Pad Name | BEOL Structure Node TBM | BEOL Structure Ground Node |
|---|---|---|---|---|
| E | 1 | EN1 | Enable Ring for Legs 1 - 5 | - |
| E | 2 | FD1 | Double Frequency for Legs 1 - 5 | - |
| E | 3 | Ref1 | 30 x .24μm M1 line | None |
| E | 4 | Test1 | 30 x .24μm M1 line | 3 x 20 x .28μm M2 Line VC |
| E | 5 | Ref 2 | 30 x .24μm M1 line | None |
| E | 6 | Test 2 | 30 x .24μm M1 line | 3 x 20 x .28μm M3 Line VC |
| E | 7 | Ref 3 | 30 x .24μm M1 line | None |
| E | 8 | Test 3 | 30 x .24μm M1 line | 3 x 20 x .28μm M4 Line VC |
| E | 9 | Ref 4 | 30 x .28μm M1 line | None |
| E | 10 | Test 4 | 30 x .28μm M1 line | 3 x 20 x .28μm M3 Line VC |
| E | 11 | Ref 5 | 30 x .24μm M2 line | None |
| E | 12 | Test 5 | 30 x .24μm M2 line | None |
| E | 13 | Vdd | Sub-Macro Vdd | - |

FIG. 12

| Sub-Macro | Pad # | Pad Name | BEOL Structure Node TBM | BEOL Structure Ground Node |
|---|---|---|---|---|
| E | 14 | Gnd | Sub-Macro Gnd | - |
| E | 15 | Ref 6 | 30 x .28 μm M2 line | None |
| E | 16 | Test 6 | 30 x .28 μm M2 line | 3 x 20 x .28μm M4 Line VC |
| E | 17 | Ref 7 | 30 x .28 μm M3 line | None |
| E | 18 | Test 7 | 30 x .28 μm M3 line | 3 x 20 x .28μm M4 Line VC |
| E | 19 | Ref 8 | 30 x .28 μm M3 line | None |
| E | 20 | Test 8 | 30 x .28 μm M3 line | 3 x 20 x .28μm M5 Line VC |
| E | 21 | Ref 9 | 30 x .28 μm M4 line | None |
| E | 22 | Test 9 | 30 x .28 μm M4 line | 3 x 20 x .28μm M5 Line VC |
| E | 23 | CLKOUT | Bottom 4 Legs Clock Signal Out | - |
| E | 24 | FD2 | Double Frequency for Legs 6 - 9 | - |
| E | 25 | EN2 | Enable Ring for Legs 6 - 9 | - |

FIG. 13

| Sub-Macro | Pad # | Pad Name | BEOL Structure Node TBM | BEOL Structure Ground Node |
|---|---|---|---|---|
| G | 1 | EN1 | Enable Ring for Legs 1 - 5 | - |
| G | 2 | FD1 | Double Frequency for Legs 1 - 5 | - |
| G | 3 | Ref1 | 30 x .24µm M1 line | None |
| G | 4 | Test1 | 30 x .24µm M1 line | 2 x 25 x .24µm M1 L S=.20µm A |
| G | 5 | Ref 2 | 30 x .24µm M1 line | None |
| G | 6 | Test 2 | 30 x .24µm M1 line | 2 x 25 x .24µm M1 L S=.20µm B |
| G | 7 | Ref 3 | 30 x .28µm M2 line | None |
| G | 8 | Test 3 | 30 x .28µm M2 line | 2 x 25 x .28µm M2 L S=.20µm A |
| G | 9 | Ref 4 | 30 x .28µm M2 line | None |
| G | 10 | Test 4 | 30 x .28µm M2 line | 2 x 25 x .28µm M2 L S=.20µm B |
| G | 11 | Ref 5 | 30 x .24µm M1 line | None |
| G | 12 | Test 5 | 30 x .24µm M1 line | None |
| G | 13 | Vdd | Sub-Macro Vdd | - |

FIG. 14

| Sub-Macro | Pad # | Pad Name | BEOL Structure Node TBM | BEOL Structure Ground Node |
|---|---|---|---|---|
| G | 14 | Gnd | Sub-Macro Gnd | - |
| G | 15 | Ref 6 | 30 x .28 μm M3 line | None |
| G | 16 | Test 6 | 30 x .28 μm M3 line | 2 x 25 x .28μm M3 L S=.28μm A |
| G | 17 | Ref 7 | 30 x .28 μm M3 line | None |
| G | 18 | Test 7 | 30 x .28 μm M3 line | 2 x 25 x .28μm M3 L S=.28μm B |
| G | 19 | Ref 8 | 30 x .28 μm M4 line | None |
| G | 20 | Test 8 | 30 x .28 μm M4 line | 2 x 25 x .28μm M4 L S=.28μm A |
| G | 21 | Ref 9 | 30 x .28 μm M4 line | None |
| G | 22 | Test 9 | 30 x .28 μm M4 line | 2 x 25 x .28μm M4 L S=.28μm B |
| G | 23 | CLKOUT | Bottom 4 Legs Clock Signal Out | - |
| G | 24 | FD2 | Double Frequency for Legs 6 - 9 | - |
| G | 25 | EN2 | Enable Ring for Legs 6 - 9 | - |

FIG. 15

| Sub-Macro | Pad # | Pad Name | BEOL Structure Node TBM | BEOL Structure Ground Node |
|---|---|---|---|---|
| H | 1 | EN1 | Enable Ring for Legs 1 - 5 | - |
| H | 2 | FD1 | Double Frequency for Legs 1 - 5 | |
| H | 3 | Ref1 | 10f x 20 x .28 μm M1  S=.84 μm | None |
| H | 4 | Test1 | 10f x 20 x .28 μm M1  S=.84 μm | 10fx20x.28μm M2 S=.84μm VC |
| H | 5 | Ref 2 | 10f x 20 x .28 μm M2  S=.84 μm | None |
| H | 6 | Test 2 | 10f x 20 x .28 μm M2  S=.84 μm | 10fx20x.28μm M3 S=.84μm VC |
| H | 7 | Ref 3 | 10f x 20 x .28 μm M3  S=.84 μm | None |
| H | 8 | Test 3 | 10f x 20 x .28 μm M3  S=.84 μm | 10fx20x.28μm M4 S=.84μm VC |
| H | 9 | Ref 4 | 10f x 20 x .28 μm M4  S=.84 μm | None |
| H | 10 | Test 4 | 10f x 20 x .28 μm M4  S=.84 μm | 10fx20x.28μm M5 S=.84μm VC |
| H | 11 | Ref 5 | 10f x 20 x .28 μm M5  S=.84 μm | None |
| H | 12 | Test 5 | 10f x 20 x .28 μm M1  S=.84 μm | None |
| H | 13 | Vdd | Sub-Macro Vdd | - |

FIG. 16

| Sub-Macro | Pad # | Pad Name | BEOL Structure Node | BEOL Structure Node TBM | BEOL Structure Ground Node |
|---|---|---|---|---|---|
| H | 14 | Gnd | Sub-Macro Gnd | | - |
| H | 15 | Ref 6 | 10f x 20 x .28 μm M1  S=1.4μm | 10f x 20 x .28 μm M1  S=1.4μm | None |
| H | 16 | Test 6 | 10f x 20 x .28 μm M1  S=1.4μm | | 10fx20x.28μm M2 S=1.4μm VC |
| H | 17 | Ref 7 | 10f x 20 x .28 μm M2  S=1.4μm | 10f x 20 x .28 μm M2  S=1.4μm | None |
| H | 18 | Test 7 | 10f x 20 x .28 μm M2  S=1.4μm | | 10fx20x.28μm M3 S=1.4μm VC |
| H | 19 | Ref 8 | 10f x 20 x .28 μm M3  S=1.4μm | 10f x 20 x .28 μm M3  S=1.4μm | None |
| H | 20 | Test 8 | 10f x 20 x .28 μm M3  S=1.4μm | | 10fx20x.28μm M4 S=1.4μm VC |
| H | 21 | Ref 9 | 10f x 20 x .28 μm M4  S=1.4μm | 10f x 20 x .28 μm M4  S=1.4μm | None |
| H | 22 | Test 9 | 10f x 20 x .28 μm M4  S=1.4μm | | 10fx20x.28μm M5 S=1.4μm VC |
| H | 23 | CLKOUT | Bottom 4 Legs Clock Signal Out | | - |
| H | 24 | FD2 | Double Frequency for Legs 6 - 9 | | - |
| H | 25 | EN2 | Enable Ring for Legs 6 - 9 | | - |

FIG. 17

| Sub-Macro | Pad # | Pad Name | BEOL Structure Node TBM | BEOL Structure Ground Node |
|---|---|---|---|---|
| — | 1 | EN1 | Enable Ring for Legs 1 - 5 | - |
| — | 2 | FD1 | Double Frequency for Legs 1 - 5 | - |
| — | 3 | Ref1 | 30 x .24 μm M1 Line | None |
| — | 4 | Test1 | 30 x .24 μm M1 Line | 25 x .28μm M2 Line Overlapping |
| — | 5 | Ref 2 | 30 x .24 μm M1 Line | None |
| — | 6 | Test 2 | 30 x .24 μm M1 Line | 25 x .28μm M3 Line Overlapping |
| — | 7 | Ref 3 | 30 x .24 μm M1 Line | None |
| — | 8 | Test 3 | 30 x .24 μm M1 Line | 25 x .28μm M3 & M5 Lines Over |
| — | 9 | Ref 4 | 30 x .24 μm M1 Line | None |
| — | 10 | Test 4 | 30 x .24 μm M1 Line | 25 x .28μm M5 Line Overlapping |
| — | 11 | Ref 5 | 30 x .28 μm M2 Line | None |
| — | 12 | Test 5 | 30 x .28 μm M2 Line | 25 x .28 m M3 Line Overlapping |
| — | 13 | Vdd | Sub-Macro Vdd | - |

FIG. 18

| Sub-Macro | Pad # | Pad Name | BEOL Structure Node TBM | BEOL Structure Ground Node |
|---|---|---|---|---|
| — | 14 | Gnd | Sub-Macro Gnd | - |
| — | 15 | Ref 6 | 30 x .24 μm M2 Line | None |
| — | 16 | Test 6 | 30 x .24 μm M2 Line | 25 x .28μm M4 Line Overlapping |
| — | 17 | Ref 7 | 30 x .24 μm M3 Line | None |
| — | 18 | Test 7 | 30 x .24 μm M3 Line | 25 x .24μm M1 & .28μm M5 LO |
| — | 19 | Ref 8 | 30 x .24 μm M3 Line | None |
| — | 20 | Test 8 | 30 x .24 μm M3 Line | 25 x .28μm M5 Line Overlapping |
| — | 21 | Ref 9 | 30 x .24 μm M5 Line | None |
| — | 22 | Test 9 | 30 x .24 μm M5 Line | 25 x .24μm M1 Line Overlapping |
| — | 23 | CLKOUT | Bottom 4 Legs Clock Signal Out | - |
| — | 24 | FD2 | Double Frequency for Legs 6 - 9 | - |
| — | 25 | EN2 | Enable Ring for Legs 6 - 9 | - |

FIG. 19

| Sub-Macro | Pad # | Pad Name | BEOL Structure Node TBM | BEOL Structure Ground Node |
|---|---|---|---|---|
| O | 1 | EN1 | Enable Ring for Legs 1 - 5 | - |
| O | 2 | FD1 | Double Frequency for Legs 1 - 5 | - |
| O | 3 | Ref1 | Stub | None |
| O | 4 | Test1 | 20 x 20 μm poly Plate | None |
| O | 5 | Ref 2 | Stub | None |
| O | 6 | Test 2 | 20 x 20 μm M1 Plate | None |
| O | 7 | Ref 3 | 20 x 20 μm M1 Plate | None |
| O | 8 | Test 3 | 20 x 20 μm M1 Plate | 20x20μm Poly Plate Underneath |
| O | 9 | Ref 4 | 20 x 20 μm M2 Plate | None |
| O | 10 | Test 4 | 20 x 20 μm M2 Plate | 20x20μm M1 Plate Underneath |
| O | 11 | Ref 5 | 20 x 20 μm M3 Plate | None |
| O | 12 | Test 5 | 20 x 20 μm M3 Plate | 20x20μm M2 Plate Underneath |
| O | 13 | Vdd | Sub-Macro Vdd | - |

FIG. 20

| Sub-Macro | Pad # | Pad Name | BEOL Structure Node TBM | BEOL Structure Ground Node |
|---|---|---|---|---|
| O | 14 | Gnd | Sub-Macro Gnd | - |
| O | 15 | Ref 6 | 20 x 20 μm M4 Plate | None |
| O | 16 | Test 6 | 20 x 20 μm M4 Plate | 20x20μm M3 Plate Underneath |
| O | 17 | Ref 7 | 20 x 20 μm M3 Plate | None |
| O | 18 | Test 7 | 20 x 20 μm M3 Plate | 20x20μm M1 Plate Underneath |
| O | 19 | Ref 8 | 20 x 20 μm M4 Plate | None |
| O | 20 | Test 8 | 20 x 20 μm M4 Plate | 20x20μm M1 Plate Underneath |
| O | 21 | Ref 9 | 20 x 20 μm M4 Plate | None |
| O | 22 | Test 9 | 20 x 20 μm M4 Plate | 20x20μm M2 Plate Underneath |
| O | 23 | CLKOUT | Bottom 4 Legs Clock Signal Out | - |
| O | 24 | FD2 | Double Frequency for Legs 6 - 9 | - |
| O | 25 | EN2 | Enable Ring for Legs 6 - 9 | - |

FIG. 21

KERF CIRCUIT FOR MODELING OF BEOL CAPACITANCES

BACKGROUND OF THE INVENTION

1. Technical Field

This invention relates to the field of semiconductor circuit testing. More specifically, the invention relates to a kerf circuit for modeling of Back End Of Line (BEOL) capacitances.

2. Background Art

In previous semiconductor technologies, much of the delay of circuits was attributed to the delay of the transistors. When simulating circuits in these technologies, it was not necessary to include the intrinsic delay of the metal interconnect because the delay was dominated by the device delay. Because of this, metal interconnect modeling has never been a major modeling priority.

In current and future technologies, however, the transistors are and will be so small that they no longer contribute as much delay to the overall circuit. More of the delay is and will be attributed to the metal interconnects between devices. If these interconnect delays are not included in circuit simulations of current and future technologies, models could underestimate circuit delay by as much as 30%. If the wiring models are incorrect, this can cause timing violations in hardware that are not detectable in simulation.

In order to model the delay from the metal wiring, test circuits must be created to test the actual resistance and capacitance of the wires. Generally, these types of test structures are placed on a semiconductor wafer in the "kerf" area, which is space on a semiconductor wafer in between chips to be used for manufacturing monitoring and modeling. For these types of structures, metal wire resistance is well understood and circuits to test metal resistance exist. Capacitance can also be tested. However, capacitance testing is currently performed through a very laborious process. In this process, a few capacitance structures are placed in the kerf on a semiconductor wafer. Sometime during the manufacturing process, one of the wafers is taken to a laboratory, connected to the proper testing equipment, and the few capacitance structures are manually tested. In this manner, several different structures may be tested for capacitance.

While the latter capacitance testing process is appropriate for a small number of structures, a normal integrated circuit on a semiconductor wafer can contain hundreds or thousands of different capacitive structures. Moreover, this testing process takes quite a bit of time and manpower. Manufacturing processes can periodically change, leading to potentially different capacitances between batches of semiconductor wafers. Even within a batch of semiconductor wafers, there may be differences in the capacitance of structures on the wafers. It is beneficial to be able to test the semiconductor wafers and report the change in capacitance to design engineers and/or process engineers. However, the current testing process is so slow that feedback to the engineers can take a long time. Finally, the current testing process requires a laboratory with particular equipment and procedures, and it is not suitable for testing in a processing line, with its large volumes of semiconductor wafers.

What is needed is a way of testing capacitance for capacitive structures on a semiconductor wafer that overcomes the problems of insufficient numbers of tests performed for capacitive structures, insufficient numbers of capacitance tests performed on wafers, and not being able to perform in-line testing of capacitances.

DISCLOSURE OF INVENTION

To overcome these problems, a kerf circuit for modeling of Back End Of Line (BEOL) capacitances is disclosed. The kerf circuit contains a clock circuit connected to a number of capacitance testing circuits. Each capacitance testing circuit acts a "bay" that can be configured to test one particular capacitance. The clock circuit allows the capacitance testing circuits to charge and discharge the capacitive structures being tested. By having a number of different capacitance testing circuits, capacitances of many different structures may be tested at one time. This is particularly true if the kerf circuit is repeated several or many times, with each different kerf circuit containing different capacitive testing circuits that themselves contain different capacitive structures.

The kerf circuit interfaces to testing equipment through pads. The pads connect to each capacitive testing circuit and allow capacitance measurements to be performed by measuring current. Because the pads are easily connected through probes to testing equipment, many semiconductor wafers can be tested quickly and easily. Many different types of capacitive structures can be tested within a short period of time using already existing equipment.

The foregoing and other features and advantages of the present invention will be apparent from the following more particular description of preferred embodiments of the invention, as illustrated in the accompanying drawings.

BRIEF DESCRIPTION OF DRAWINGS

Preferred embodiments of the present invention will hereinafter be described in conjunction with the appended drawings, where like designations denote like elements, and.

BEST MODE(S) FOR CARRYING OUT THE INVENTION

Figure 1:
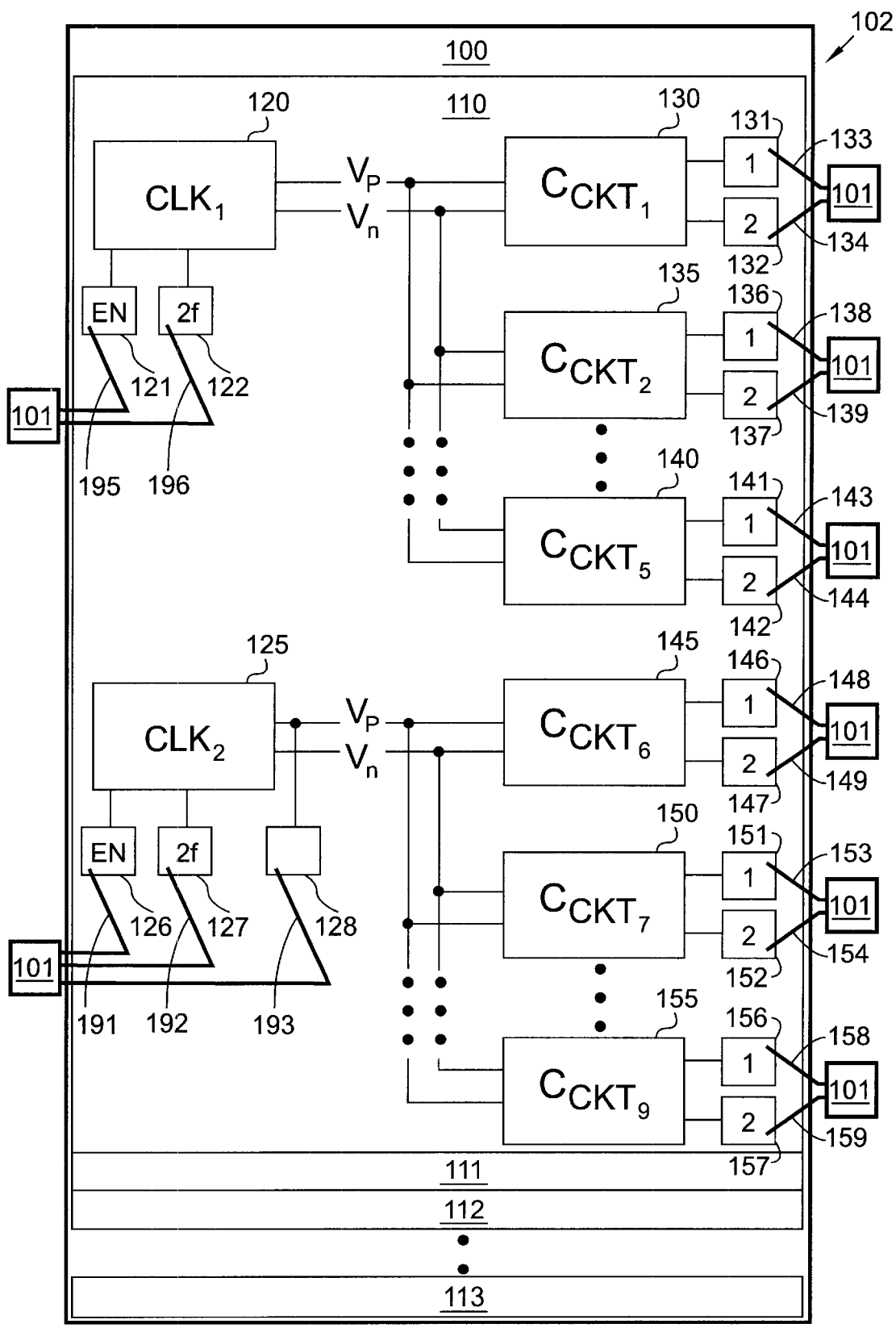
FIG. 1 is an apparatus for testing multiple capacitance structures in accordance with a preferred embodiment of the present invention.

A kerf circuit for modeling of Back End Of Line (BEOL) capacitances is disclosed. The kerf circuit contains a clock circuit connected to a number of capacitance testing circuits. Each capacitance testing circuit acts a "bay" that can be configured to test one particular capacitance. The clock circuit allows the capacitance testing circuits to charge and discharge the capacitive structures being tested. By having a number of different capacitance testing circuits, capacitances of many different structures may be tested at one time. This is particularly true if the kerf circuit is repeated several or many times, with each different kerf circuit containing different capacitive testing circuits that themselves contain different capacitive structures.

The kerf circuit interfaces to testing equipment through pads. The pads connect to each capacitive testing circuit and allow capacitance measurements to be performed by measuring current. A Direct Current (DC) voltage is placed onto the pads and the current passing into each of the capacitive testing circuits is measured. Because the pads are easily connected through probes to testing equipment, many semiconductor wafers can be tested quickly and easily. Many different types of capacitive structures can be tested within a short period of time using already existing equipment.

Preferably, there will be more than one clock circuit per kerf circuit. Some of the capacitance testing circuits will be connected to one of the clock circuits. Most preferably, there will be one clock circuit for about every four capacitance testing circuits. This limits the length of travel of individual clock signals.

In the most preferred embodiment of the present invention, each clock circuit can produce clock signals at more than one frequency. Additionally, the capacitive testing circuits are designed with enough margin so that multiple DC voltages may be used when testing capacitance. By designing the capacitance testing circuits this way, any voltage and/or frequency dependencies of the capacitive structure under test may be calculated and eliminated. This provides a more exact calculation of the capacitance than would be possible with only one capacitance calculation.

Each capacitive testing circuit can preferably test one capacitance. Each kerf circuit can contain a number of capacitive testing circuits. Each kerf circuit can be repeated many times. Each capacitance can be tested using Direct Current (DC) probes, and can be tested in a semiconductor manufacturing line. Moreover, the kerf circuits are self-contained, meaning that they have their own clock circuits. Instead of taking a semiconductor wafer to a lab and applying the DC voltage and clock signals to the capacitive testing circuits, the kerf circuit's clocks automatically generate the appropriate signals to test the capacitive structures. Because of this flexibility, a very large number of different capacitances may be tested from one semiconductor wafer, and many semiconductor wafers may be simply and easily tested.

Thus, the present invention allows a tremendous volume of data about capacitance to be produced simply, conveniently, and in a current manufacturing line using current equipment. This data can then be used for design manuals, process development, and mathematical models for the current process. Thus, design and process engineers can get relevant, accurate data in a timely manner.

Referring now to FIG. 1, an apparatus 102 for testing capacitance is shown. Apparatus 102 comprises a testing apparatus 101 that interfaces with kerf region 100 of a semiconductor wafer (for simplicity, the rest of the semiconductor wafer is not shown). Kerf region 100 is a region on a semiconductor wafer between chips. This area is used for test circuitry and for other reasons. It should be noted that the kerf circuits disclosed in the present invention do not have to be placed into the kerf region; it is possible to place these circuits in the chip region. However, the kerf region is the best place for these circuits, as the circuits would not take up valuable chip space.

Kerf region 100 comprises a number of kerf circuits 110, 111, 112, and 113. Any number of kerf circuits may be placed in kerf region 100. Each kerf circuit is designed to test the capacitance of a number of different structures on the semiconductor wafer. In the example of FIG. 1, kerf circuit 110 comprises clock circuits 120, 125, enable pads 121, 126, double frequency pads 122, 127, clock signal output pad 128, capacitance testing circuits 130, 135, 140, 145, 150, and 155, and pads 131, 132, 136, 137, 141, 142, 146, 147, 151, 152, 156, and 157. Testing apparatus 101 is respectively coupled to enable pads 121, 126 through probes 195, 196 (and associated wiring, not numbered for this and subsequent probe equipment), to double frequency pads 122, 127 through probes 191, 192, to clock signal output pad 128 through probe 193, and to pads 131, 132, 136, 137, 141, 142, 146, 147, 151, 152, 156, and 157 through probes 133, 134, 138, 139, 143, 144, 148, 149, 153, 154, 158, and 159.

Most preferably, there are nine capacitive testing circuits 130, 135, . . . , 140, 145, 150, . . . , 155. Preferably, one clock circuit produces two clock signals Vp and Vn that are routed to a number of capacitive testing circuits. While it is possible for each clock circuit to produce less or more than two clock signals, having two clock signals is beneficial. In particular, with two clock signals, one clock signal can be used to charge capacitive structures, and the other clock signal can be used to discharge the capacitive structures, and both of these operations can be independently performed.

Most preferably, each clock circuit's clock signals are routed to a portion of the capacitive testing circuits. For instance, in the example of FIG. 1, clock circuit 120 has clock signals that are routed to five of the nine capacitive testing circuits (capacitive testing circuits 130, 135, . . . , 140). Clock circuit 125 has clock signals that are routed to four of the nine capacitive testing circuits (capacitive testing circuits 145, 150, . . . , 155). Although routing the clock signals in this manner is not necessary, routing the clock signals this way reduces the length that the clock signals must travel.

Figure 2:
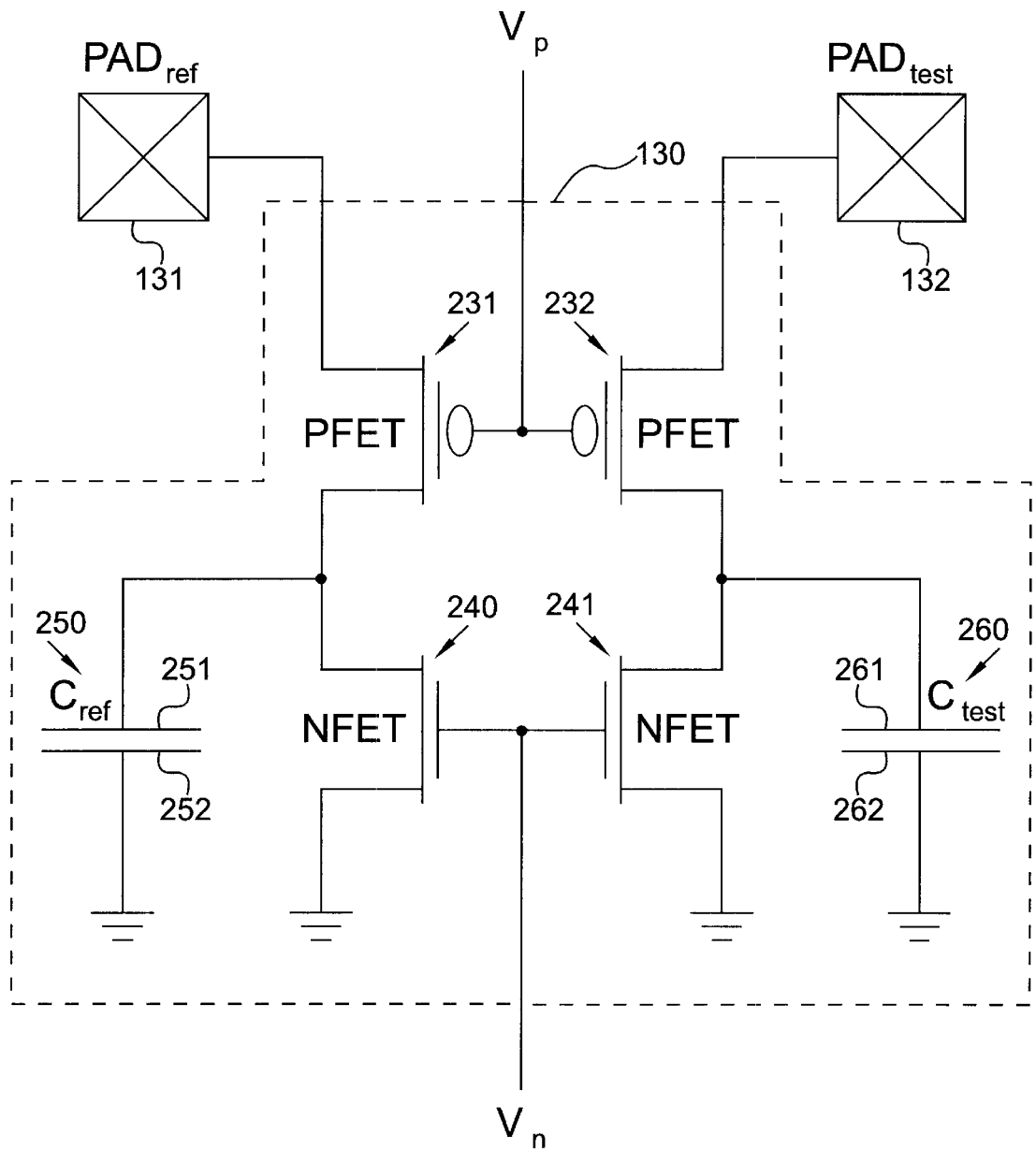
FIG. 2 illustrates the most preferred capacitance testing circuit of the present invention.

Each capacitance testing circuit 130, 135, 140, 145, 150, and 155 tests one particular capacitance between two integrated circuit structures. Any circuit for testing capacitance of integrated circuit structures may be used. The most preferred capacitance testing circuit for use with the present invention is shown in FIG. 2, to be discussed below. However, other circuits may be used.

Each enable pad 121, 126 will enable its respective clock circuit 120, 125. When enabled, each clock circuit 120, 125 will preferably produce clock signals having one particular frequency. Double frequency pads 122, 127 cause each clock circuit 120, 125 to produce clock signals that are double the frequency of that produced when pads 121, 126 are used alone. By allowing each clock circuit to produce clock signals that are adjustable to two different frequencies, two different capacitance measurements may be made at these frequencies. The capacitances measured at both frequencies should be within a margin of error. By applying the appropriate signals at enable pads 121, 126 and at double frequency pads 122, 127, the testing apparatus 101 can force either of the frequencies. It should be noted that the clock circuits 120, 125 are preferably designed so that the enable pads 121, 126 must have the correct signal on them before signals on double frequency pads 122, 127 will be valid. In other words, once the clock circuits are enabled through appropriate signals on the enable pads, then signals on the double frequency pads will have effect.

The testing apparatus 101 uses clock signal output pad 128 for timing purposes. Specifically, the signal on the clock signal output pad 128 helps the testing apparatus determine when the capacitive structures in the capacitance testing circuits are being charged and discharged.

The testing apparatus 101 can place a DC voltage on probes 133, 134, 138, 139, 143, 144, 148, 149, 153, 154, 158, and 159. Preferably, the same DC voltage is placed on all of the probes at the same time. In other words, probe 133 would have the same DC voltage placed on it as probe 138 would. However, it is possible to place different DC voltages on different probes at the same time. For instance, probe 133 could have DC voltage A place on it, while probe 138 has DC voltage B placed on it.

By analyzing the current the passes into the capacitive structure in the capacitance testing circuits, one can test capacitance. Additionally, each pad 131, 132, 136, 137, 141, 142, 146, 147, 151, 152, 156, and 157 and each capacitance testing circuit is preferably designed to allow varying voltages to be placed on the pads. This allows a multitude of capacitive measurements at different voltages to be quickly and easily made. By measuring current at different voltages, dependencies in voltage and frequency can be calculated and eliminated from the capacitance measurement. This results in better and more accurate capacitance determinations.

Thus, FIG. 1 shows that a multitude of different capacitive measurements may be taken over a short period of time. During this short period of time, multiple capacitive structures can be tested at a variety of frequencies (of charging and discharging) and voltages. Moreover, the charging and discharging of capacitive structures is automatically performed by on-chip clock circuits and their associated capacitance testing circuits; no external clocking mechanism is needed. A tremendous quantity of information may be determined for each semiconductor in a semiconductor wafer manufacturing line. Moreover, many semiconductor wafers may be tested. Using the present invention in this repeated manner gives a much better indication of the real capacitance caused by integrated circuit structures on the semiconductor wafer. This information, in turn, may be assimilated more quickly into design manuals, assimilated into simulation models, and given to the process development team.

Turning now to FIG. 2, this figure shows a capacitance testing circuit 130 that is the most preferred capacitance testing circuit for use with the present invention. The capacitance testing circuit 130 is coupled to a reference pad 131 and a test pad 132.

In the most preferred embodiment of the present invention, each capacitance testing circuit (e.g., capacitance testing circuit 130) preferably contains two legs, a reference leg and a test leg. In FIG. 2, the reference leg comprises the PFET (P-Field Effect Transistor) 231, the NFET 240, and the reference capacitive structure 250. The test leg comprises the PFET 232, NFET 241 and capacitive structure 260. Each leg is designed to test a capacitive structure.

Each capacitive structure has a top "plate" 251, 261 and a bottom "plate" 261, 252. Each plate is made up of one or more integrated circuit structures. The reference leg is used to determine a reference capacitance that is subsequently subtracted from the test capacitance to create a resultance capacitance. The reference capacitance comprises the capacitance from the reference capacitive structure, and the test capacitance comprises the capacitance from the test capacitive structure. The resultant capacitance tests the capacitance of integrated circuit structures that differ between the reference and test capacitive structures. This will become more apparent after several examples given when discussing FIGS. 6 through 21.

PFETs 231, 232 act as electrical switches to charge capacitive structures 250, 260, respectively. When the clock signal Vp is the appropriate value, the PFETs turn on and electrically connect reference pad 131 to reference capacitive structure 250 and test pad 132 to test capacitive structure 260. If a voltage is placed onto reference 131 and test 132 pads (and the NFETs 240, 241 are off), the capacitive structures 250, 260 will charge. NFETs 240, 241, on the other hand, act as electrical switches to discharge capacitive structures 250, 260, respectively. When the clock signal Vp is the appropriate value, the NFETs turn on and electrically connect the top plates 251, 261 of the capacitive structures 250, 260 to ground. If the PFETs 231, 232 are off, the capacitive structures 250, 260 will discharge to ground.

Most preferably, each leg of the capacitance testing circuit 130 is balanced, except for any difference between the capacitive structures. In other words, the wiring connecting pads to PFETs should be very nearly the same length, should have similar routing, and should be made of the same material. The wiring connecting outputs of the PFETs to inputs of the NFETs and to the capacitive structures should also be very nearly the same length, should have similar routing, and should be made of the same material.

The capacitance testing circuit 130 is used in the following manner. A voltage is placed onto the reference 131 and test 132 pads. The capacitive structures 250, 260 are charged by enabling PFET switches 231, 232, while disabling NFET switches 240, 241. The current into the capacitive structures is recorded and integrated. The integral of current divided by time will yield charge. The charge divided by voltage will yield capacitance. The capacitive structures 250, 260 are discharged by enabling NFET switches 240, 241, while disabling PFET switches 231, 232. The process can then be repeated, using the same or a different voltage, or by using a faster or slower charging period, which is related to the frequency of the clock circuit. Repeating the process with different voltages and/or frequencies is important, as this provides for a better capacitance calculation.

Note that, with this particular capacitance testing circuit, it is preferred that the PFET switches 231, 232 not be enabled at the same time that the NFET switches 240, 241 are enabled. If both sets of switches are enabled at the same time, the reference and test pads will be directly coupled to ground.

Figure 3:
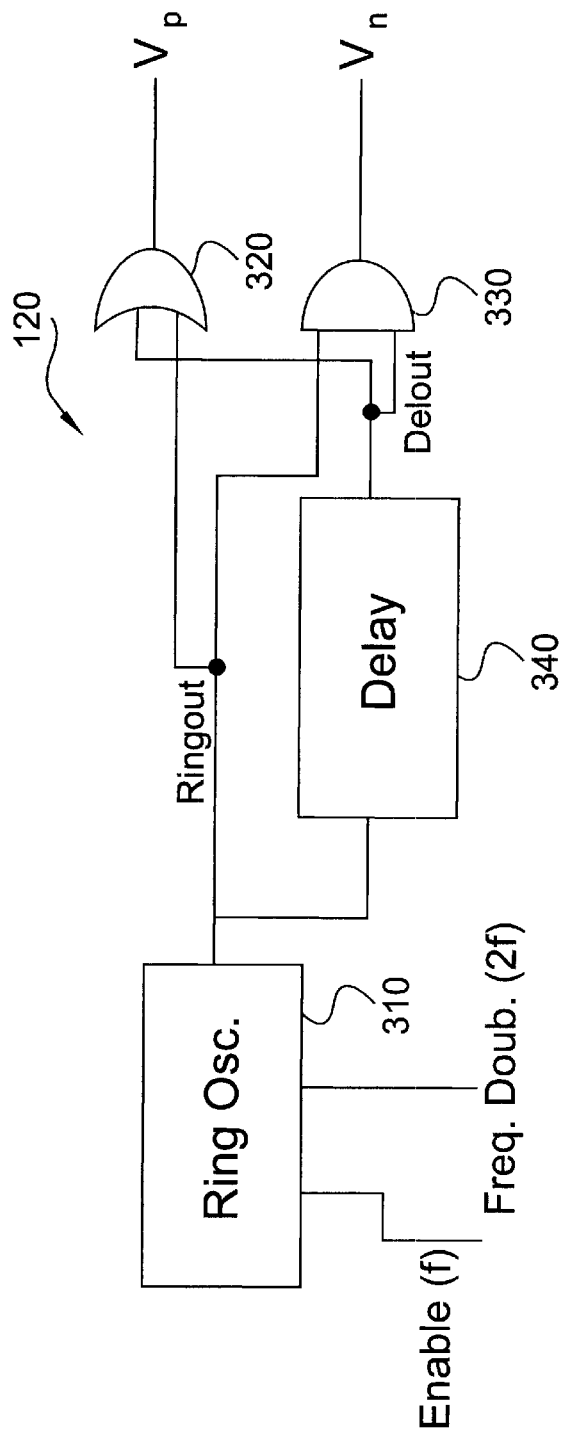
FIG. 3 illustrates the most preferred clock circuit of the present invention.

A clock circuit that ensures that the Vp and Vn clock signals are not active values at the same time is shown in FIG. 3. Referring now to this figure, a clock circuit 120 is shown. Clock circuit 120 comprises a ring oscillator 310 coupled to a delay 340 and producing a Ringout signal. The Ringout signal is coupled to an OR gate 320 and an AND gate 330. The delay 340 produces a Delayout signal that is also coupled to OR gate 320 and AND gate 330. The delay 340 produces a delayed version of the Ringout output of the ring oscillator 310. Delay 340 could be any delay known to those skilled in the art, such as a series of inverters that contains an even number of inverters.

Figure 4:
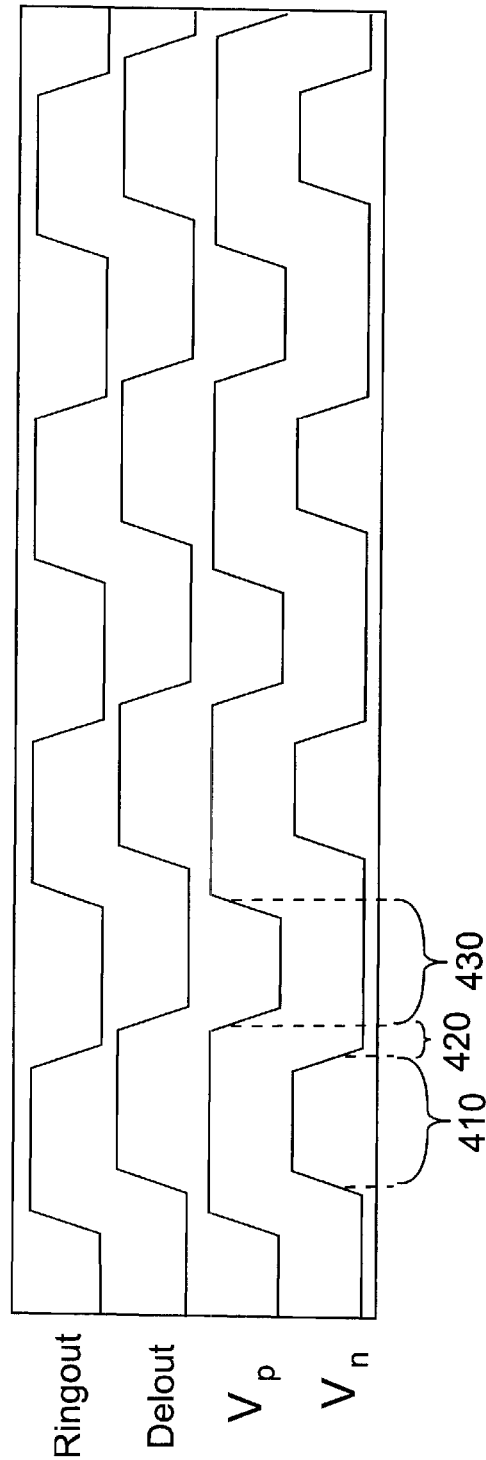
FIG. 4 illustrates exemplary outputs of various portions of the clock circuit of FIG. 3.

Outputs produced by the clock circuit of FIG. 3 are shown in FIG. 4. Turning to FIG. 4 in addition to FIG. 2, Ringout is an output signal produced by the ring oscillator 310. Delout is a delayed version of Ringout. Clock signal Vp will activate PFET switches 231, 232 when Vp is some value beneath the high voltage (Vdd) for the system. This is indicated by PFET activation period 430. Similarly, clock signal Vn will activate NFET switches 240, 241 when Vn is some value above ground for the system. This is indicated by NFET activation period 410. There is a period 420 during which the NFET and PFET switches are off. Selection and design of delay 340 will increase or decrease period 420.

Returning to FIG. 2, each capacitive structure 250, 260 has a top "plate" 251, 261 and a bottom "plate" 252, 262. Each plate is made up of one or more integrated circuit structures. The reference leg is used to determine a reference capacitance that is subsequently subtracted from the test capacitance to create a resultance capacitance. The reference capacitance comprises the capacitance from the reference capacitive structure, and the test capacitance comprises the capacitance from the test capacitive structure. The resultant capacitance tests the capacitance of integrated circuit structures that differ between the reference and test capacitive structures.

For instance, assume that the top plate of the reference capacitive structure is a metal line on the M1 level and the bottom plate of the reference capacitive structure is the substrate, which should be grounded. The integrated circuit structure for the top plate is the metal line on the M1 level, while the integrated circuit structure for the bottom plate is the substrate. This reference capacitive structure measures the capacitance (the "reference" capacitance) between the M1 metal line and the substrate.

Next, assume that the top plate of the test capacitive structure is a metal line on the M1 level and the bottom plate of the reference capacitive structure is the substrate and a metal line on the M3 level. Both the substrate and the metal line on the M3 level should be grounded. Note that the substrate is generally always present. This particular test capacitive structure will thus measure the capacitance (the "test" capacitance) between the M1 metal line and the substrate and the capacitance between the M1 and M3 metal lines. Because the reference capacitive structure also measures the former capacitance, subtracting the reference capacitance from the test capacitance will yield a resultant capacitance. The resultant capacitance is the capacitance between the M1 and M3 metal lines and is the capacitance that the capacitance testing circuit was designed to measure.

Thus, capacitance testing circuit 130 is designed to test the capacitance between two or more integrated circuit structures. The reference capacitance is used to remove unwanted capacitance so that the capacitance of specific integrated circuits may be tested.

FIGS. 6 through 21 illustrate a multitude of different capacitive structures and capacitance testing circuits. Each of these figures represents one "sub-macro" that contains the definitions for one kerf circuit 110 (see FIG. 1). The various kerf circuits could be combined into one macro.

Referring now to FIGS. 6 and 7 in addition to FIG. 1, a kerf circuit A is shown. In this and following figures, "TBM" stands for "To Be Measured". The "BEOL Structure Node TBM" is the top plate of the capacitive structure. Similarly, the "BEOL Structure Ground Node" is the bottom plate of the capacitive structure. Note, however, that the substrate is present and grounded in these examples, and it acts as an integrated circuit structure on the bottom plate.

As shown in FIG. 1, there are a number of pads per kerf circuit. Not all pads illustrated in FIGS. 6 through 21 are shown in FIG. 1. The first pad is called an enable ring for legs 1–5. This pad is pad 121 from FIG. 1. Preferably, when an appropriate signal is placed on pad 121, clock circuit 120 is enabled and starts outputting clock signals Vp and Vn at an appropriate frequency. When an appropriate signal is placed on pad number two (pad 122 in FIG. 1), clock circuit 120 will output clock signals Vp and Vn at double the frequency. Each "leg" is a capacitance testing circuit. Preferably, if an appropriate signal is removed from pad 121, the clock circuit will be disabled, and the clock signals will be disabled regardless of the signal on pad number two (pad 122 in FIG. 1).

Kerf circuit A tests particular lengths of particular lines. For instance, pad 3 connects to a reference capacitive structure that tests the capacitance of a 10 micron (um) long by 0.24 um wide metal M1 line to substrate. The top plate for the reference capacitive structure is the M1 line and the bottom plate is the substrate. In this instance, there is one integrated circuit structure per the top plate. Pad 4 connects to a test capacitive structure that is a 30 um long by 0.24 um wide M1 line. The top plate for the test capacitive structure is the M1 line and the bottom plate is the substrate. The bottom plate contains two integrated circuit structures. The capacitance being measured is the capacitance from a 0.24 um wide by 20 um length of M1 line to substrate. Pads 5 through 10 measure the capacitance of 20 um lines to substrate where the lines are on different levels. Pads 11 and 12 is a control: both the reference and test capacitive structures are the same. Theoretically, the difference in capacitance between these structures should be very small, within measurement error. Finally, pads 14 through 22 measure the capacitance of 20 um lines to substrate, where the lines are on different levels and slightly wider. In this example, the minimum width for the metal level was used to create the capacitance testing circuits. For this example, the semiconductor wafer technology used allows the metal width of structures on M1 to be smaller than the metal width on other metal levels. Other semiconductor wafer technologies may have different recommendations of metal width.

Turning now to FIGS. 8 and 9, the capacitance between combs is being tested. In this example, pad three is connected to a reference capacitive structure that has a top plate of a 10 finger comb. Each finger is a 20 um line that is 0.28 um wide. The spacing (centerline to centerline) is 0.84 um. The bottom plate for the reference capacitive structure is substrate. For the test capacitive structure, the top plate is the same comb as in the reference structure, while the bottom plate is the same comb interleaved (each finger of this comb resides between fingers of the top plate's comb) on the same level as the top plate's comb and the substrate. Thus, the bottom plate again contains two integrated circuit structures. The capacitance being measured is the capacitance between the two interleaved combs. Again, pads 11 and 12 measure a control capacitance, and the other capacitance testing circuits test combs on different metal levels.

Turning now to FIGS. 10 and 11, "VC" stands for Vertical Crossing, meaning that the "vertical" line is on a metal level different from the top plate line's metal level and crosses the top plate line at a right angle. In this case, "vertical" has significance for both the metal level and for how the two lines are situated with respect to each other. Thus, the capacitance being measured in this figure is the capacitance between a top plate line on one level and a bottom plate line on another level.

FIGS. 12 and 13 illustrate a number of capacitance testing circuits that measures the capacitance between a top plate line on one level and three bottom plate lines on another level. "VC" again stands for Vertical Crossing and means that the three bottom plate lines are on a different metal level and perpendicular to the top plate line. In this instance, there are four integrated circuit structures on the bottom plate of the test capacitive structure: three vertical lines and the substrate.

FIGS. 14 and 15 illustrate a number of capacitance testing circuits that measure the capacitance between a top plate line and two bottom plate lines. In this example, "L" stands for Line, "A" stands for Alternating, "B" stands for Below, and "S" stands for Spacing. For alternating lines, one bottom plate line is beneath the top plate line and one bottom plate line is above the top plate line. Additionally, the top plate line crosses the bottom plate lines at right angles to each bottom plate line. For below lines, both bottom plate lines are parallel to the top plate line but beneath it. The spacing indicated is the spacing between the additional top plate lines.

FIGS. 16 and 17 illustrate a number of capacitance testing circuits that measure the capacitance between a top plate comb and a vertical, or bottom plate comb. The vertical comb is on a different metal level from the top plate comb and crosses the top plate comb at a right angle.

FIGS. 18 and 19 illustrate a number of capacitance testing circuits that measure the capacitance between a top plate line and one or more overlapping, bottom plate lines ("overlapping" or "LO" or "Over"). "Overlapping" means that the overlapping lines are directly above or below the top plate line.

Finally, FIGS. 20 and 21 illustrate a number of capacitance testing circuits that measure the capacitance between square metallic plates that are on different metal levels.

Thus, FIGS. 6 through 21 illustrate a large variety of different capacitances that can be tested. Moreover, these can be tested very quickly and with little interruption to a semiconductor process line.

Figure 5:
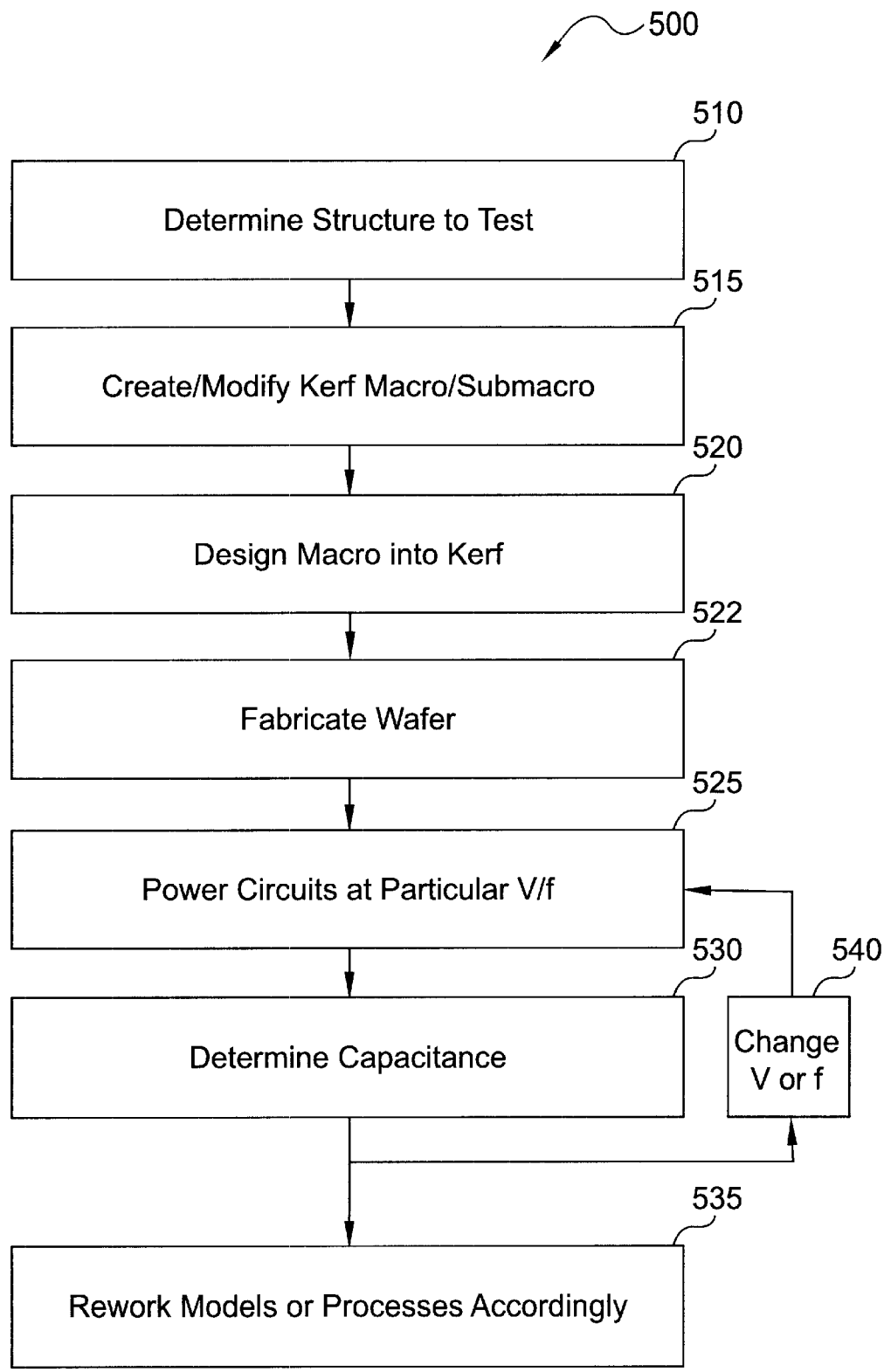
FIG. 5 illustrates a method in accordance with a preferred embodiment of the present invention for testing capacitances of kerf capacitance structures; and Each group of FIGS. 6 & 7, 8 & 9, 10 & 11, 12 & 13, 14 & 15, 16 & 17, 18 & 19, 20 and 21 represent one kerf circuit created in accordance with a preferred embodiment of the present invention.

Referring now to FIG. 5, a method 500 is shown for creating kerf macros, testing capacitances of integrated circuit structures, and using the resultant data. Method 500 allows one to design kerf macros (kerf circuits) that test a variety of capacitances and to gain valuable capacitive data. Method 500 begins when a developer determines an integrated circuit structure to test (step 510). There will be any number of commonly used structures on an integrated circuit, and these structures might change as technology changes. A developer familiar with the current semiconductor wafer manufacturing and processing can determine which structures are most likely required to adequately model the current process.

Once this is done, the developer inserts this structure into an existing kerf macro or creates a new kerf macro having the structure (step 515). The macro, in the course of semiconductor wafer design, is designed into the kerf (step 520). The kerf could contain additional structures, such as resistive measuring circuits, and the kerf circuits of the present invention are placed into the kerf region. In step 522, the semiconductor wafer is fabricated. At this point, the actual physical structures of the kerf circuit are on a semiconductor wafer. A test apparatus is used to power the circuits at a particular voltage and frequency (step 525). The test apparatus provides the DC voltage to the test and reference pads, and provides the appropriate signals on the enable and double frequency pads to enable the clock circuits and to select the clock frequencies. The capacitance of each capacitance testing circuit is determined in the manner already discussed (step 530). The test apparatus can measure current, for each DC voltage probe, from a large number of capacitance testing circuits.

In step 540, the voltage and/or frequency is changed (step 540) to allow for multiple measurements at particular voltages or frequencies. This step helps to eliminate voltage and/or frequency dependencies and provides a more accurate analysis of capacitance. Once this data is extracted, the mathematical models for the structures can be updated, the design manuals can be updated, or the development team can be informed of the new capacitance values (step 535). Note that reducing capacitance reduces delay and improves timing.

What has been shown is a system and method for measuring capacitance of integrated circuit structures on a large scale. The system is largely self-contained and automatic. Little outside information or interaction is needed for a large amount of data on the capacitance of integrated circuit structures to be determined.

While the invention has been particularly shown and described with reference to preferred embodiments thereof, it will be understood by those skilled in the art that various changes in form and details may be made therein without departing from the spirit and scope of the invention. Accordingly, unless otherwise specified, any dimensions of the apparatus indicated in the drawings or herein are given as an example of possible dimensions and not as a limitation. Similarly, unless otherwise specified, any sequence of steps of the method indicated in the drawings or herein are given as an example of a possible sequence and not as a limitation.

What is claimed is:

1. A circuit comprising:
    a clock circuit, the clock circuit able to produce at least one clock signal;
    a capacitance testing circuit coupled and responsive to the at least one clock signal to test capacitance of at least one capacitive structure, said capacitance testing circuit comprising:
        a reference leg comprising a reference capacitive structure; and
        a test leg comprising a test capacitive structure; and
    at least one pad coupled to at least one of the reference leg and the test leg of the capacitance testing circuit, the at least one pad suitable to receive a Direct Current (DC) voltage, and the at least one pad adapted to receive an externally applied probe.

2. The circuit of claim 1 wherein the clock circuit comprises a means for producing at least one clock signal, and wherein the capacitive testing circuit comprises a means for testing capacitance of at least one capacitive structure.

3. The circuit of claim 1 wherein the clock circuit comprises two modes of operation, wherein in a first mode of operation the clock circuit generates the at least one clock signal having an output at a first frequency, and wherein in a second mode of operation the clock circuit generates the at least one clock signal having an output at a second frequency.

4. A circuit comprising:
    a clock circuit, the clock circuit able to produce at least one clock signal, wherein the clock circuit comprises two modes of operation, wherein in a first mode of operation the clock circuit generates the at least one clock signal having an output at a first frequency, and wherein in a second mode of operation the clock circuit generates the at least one clock signal having an output at a second frequency;
    a capacitance testing circuit coupled and responsive to the at least one clock signal to test capacitance of at least one capacitive structure;
    at least one pad coupled to the capacitance testing circuit, the at least one pad suitable to receive a Direct Current (DC) voltage; and
    an enable pad coupled to the clock circuit and a second frequency pad coupled to the clock circuit, the clock circuit responsive to an enable signal on the enable pad to enable the clock circuit and to generate the at least one clock signal having an output at the first frequency, and the clock circuit responsive to a second signal on the second frequency pad to generate the at least one clock signal having an output at the second frequency, wherein the clock circuit is only responsive to the second signal on the second frequency pad if the enable signal on the enable pad has a predetermined value.

5. A circuit comprising:
a clock circuit, the clock circuit able to produce at least one clock signal;
a capacitance testing circuit coupled and responsive to the at least one clock signal to test capacitance of at least one capacitive structure,
at least one pad coupled to the capacitance testing circuit, the at least one pad suitable to receive a Direct Current (DC) voltage; and
wherein the at least one pad comprises two pads;
wherein the capacitance testing circuit comprises:
at least one leg, each leg of the at least one leg comprising first and second
switches, each switch having an input and an output, wherein the input of the first
switch is coupled to one of the pads, wherein the output of the first switch is
coupled to the input of the second switch and coupled to one capacitive structure
of the at least one capacitive structure, and wherein the output of the second
switch is coupled to ground; and
whereby, when a DC voltage is applied to the at least one pad, activating the first switch for one leg of the at least one leg will charge one of the at least one capacitive structures, activating the second switch for one leg of the at least one leg will discharge one capacitive structure of the at least one capacitive structure, and capacitance for capacitive structures can be measured by measuring current passing into the at least one pad.

6. A circuit comprising:
a clock circuit, the clock circuit able to produce at least one clock signal wherein the at least one clock signal comprises first and second clock signals;
a capacitance testing circuit coupled and responsive to the at least one clock signal to test capacitance of at least one capacitive structure;
wherein the at least one capacitive structure comprises a reference capacitive structure and a test capacitive structure;
wherein the capacitance testing circuit comprises:
a reference leg comprising first and second switches, each switch having an input and an output, wherein the input of the first switch is coupled to the reference pad, wherein the output of the first switch is coupled to the input of the second switch and coupled to the reference capacitive structure, wherein the output of the second switch is coupled to ground, wherein the first switch is activated and deactivated by the first clock signal, and wherein the second switch is activated and deactivated by the second clock signal; and
a test leg comprising third and second switches, each switch having an input and an output, wherein the input of the first switch is coupled to the test pad, wherein the output of the first switch is coupled to the input of the second switch and coupled to the test capacitive structure, wherein the output of the second switch is coupled to ground, wherein the third switch is activated and deactivated by the third clock signal, and wherein the fourth switch is activated and deactivated by the fourth clock signal; and
whereby, when a DC voltage is applied to the reference and test pads, activating the first and third switches will charge the reference and test capacitive structures, activating the second and fourth switches will discharge the reference and test capacitive structures, and capacitance for the reference and test capacitive structures can be measured by measuring current passing into the reference and test pads; and
at least one pad coupled to the capacitance testing circuit, the at least one pad suitable to receive a Direct Current (DC) voltage, wherein the at least one pad comprises reference and test pads.

7. The circuit of claim 6 wherein the first and third switches comprise P-Field Effect Transistors (FETs), wherein the second and fourth switches comprise N-FETs.

8. The circuit of claim 6 wherein the reference capacitive structure comprises a top plate comprising at least one first integrated circuit structure and a bottom plate comprising at least one second integrated circuit structure, and wherein the test capacitive structure comprises a top plate comprising at least one third integrated circuit structure and a bottom plate comprising at least one fourth integrated circuit structure.

9. The circuit of claim 6 wherein when the first and third switches are active, the second and fourth switches are inactive.

10. The circuit of claim 9 wherein the clock circuit comprises a ring oscillator, a delay, an AND gate and an OR gate, the ring oscillator having an output, the output coupled to the delay, coupled to an input to the OR gate, and coupled to an input to the AND gate, an output of the delay coupled to a second input of the OR gate and a second input of the AND gate, wherein the first clock signal is an output of the OR gate, and wherein the second clock signal is an output of the AND gate.

11. An apparatus comprising at least one kerf circuit, each of the at least one kerf circuits comprising:
at least one clock circuit, the at least one clock circuit producing first and second clock signals;
a plurality of capacitance testing circuits coupled and responsive to the first and second clock signals, each of the capacitance testing circuits comprising:
a reference leg comprising a reference capacitive structure and first and second switches, the first switch responsive to the first clock signal to charge the reference capacitive structure, and the second switch responsive to the second clock signal to discharge the reference capacitive structure; and
a test leg comprising a test capacitive structure and third and fourth switches, the third switch responsive to the first clock signal to charge the test capacitive structure, and the fourth switch responsive to the second clock signal to discharge the test capacitive structure; and
reference and test pads for each of the capacitance testing circuits, each reference pad coupled to an input of the first switch of one of the capacitance testing circuits and suitable to receive a Direct Current (DC) voltage, each test pad coupled to an input of the third switch of one of the capacitance testing circuits and suitable to receive a DC voltage.

12. The apparatus of claim 11 further comprising a test apparatus having a plurality of probes, some of the plurality of probes coupled to the reference and test pads that are coupled to the capacitance testing circuits.

13. The apparatus of claim 11 wherein the reference capacitive structure comprises a top plate comprising at least one first integrated circuit structure and a bottom plate comprising at least one second integrated circuit structure, and wherein the test capacitive structure comprises a top plate comprising at least one third integrated circuit structure and a bottom plate comprising at least one fourth integrated circuit structure.

14. The apparatus of claim 11 wherein the first and third switches comprise P-Field Effect Transistors (FETs), wherein the second and fourth switches comprise N-FETs.

15. The apparatus of claim 11 wherein the at least one kerf circuit comprises a plurality of kerf circuits.

16. The apparatus of claim 11 wherein for each of the at least one kerf circuits:
the at least one clock circuit comprises two clock circuits, each clock circuit producing its own first and second clock signals, the first and second clock signals for one of the clock circuits coupled to a portion of the plurality of capacitance testing circuits and the first and second clock signals for the other of the clock circuits coupled to a different portion of the plurality of capacitance testing circuits.

17. The apparatus of claim 11 wherein when the first and third switches are active, the second and fourth switches are inactive.

18. The apparatus of claim 17 wherein each of the at least one clock circuits comprises a ring oscillator, a delay, an AND gate and an OR gate, the ring oscillator having an output, the output coupled to the delay, coupled to an input to the OR gate, and coupled to an input to the AND gate, an output of the delay coupled to a second input of the OR gate and a second input of the AND gate, wherein the first clock signal is an output of the OR gate, and wherein the second clock signal is an output of the AND gate.

19. The apparatus of claim 11 wherein each of the two clock circuits comprises two modes of operation, wherein in a first mode of operation each clock circuit generates its first and second clock signals at a first frequency, and wherein in a second mode of operation each clock circuit generates its first and second clock signals having an output at a second frequency.

20. The apparatus of claim 19 further comprising, for each of the two clock circuits, an enable pad and a second frequency pad coupled to the clock circuit, each clock circuit responsive to an enable signal on its enable pad to enable the clock circuit and to generate the first and second clock signals at the first frequency, and each clock circuit responsive to a second signal on the second frequency pad to generate the first and second clock signals at the second frequency, wherein each clock circuit is only responsive to the second signal on the second frequency pad if the enable signal on the enable pad is a predetermined value.

21. The apparatus of claim 20 further comprising a test apparatus comprising a plurality of probes, each probe coupled to one pad of the enable pads, the second frequency pads, the reference pads or the test pads.

22. The apparatus of claim 21 wherein the at least one kerf circuit is a plurality of kerf circuits.

23. A method for testing capacitance, the method comprising the steps of:
providing at least one kerf circuit, each of the at least one kerf circuits comprising:
at least one clock circuit, the at least one clock circuit producing at least one clock signal; and
at least one capacitance testing circuit coupled and responsive to the at least one clock signal, each of the capacitance testing circuits comprising:
a reference leg comprising a reference capacitive structure, said reference leg having an exposed pad coupled to said reference capacitive structure; and
a test leg comprising a test capacitive structure, said test leg having an exposed pad coupled to said test capacitive structure;
charging the capacitive structures in one of the kerf circuits by setting the at least one clock signal to a predetermined value; and
measuring capacitance of the capacitive structures in the one kerf circuit by measuring current flowing into each of the capacitive structures.

24. The method of claim 23 wherein the step of measuring capacitance of the capacitive structures in the one kerf circuit by measuring current into each of the capacitive structures further comprises the steps of:
integrating the current over time to determine charge; and
dividing charge by a value of the first DC voltage to determine capacitance.

25. The method of claim 23 wherein the step of measuring capacitance of the capacitive structures in the one kerf circuit by measuring current into the capacitive structures comprises the steps of:
applying a first Direct Current (DC) voltage to inputs of the capacitive structures in the one kerf circuit;
measuring current into the capacitive structures;
discharging the capacitive structures in the one kerf circuits by setting the at least one clock signal to a second predetermined value;
applying a second Direct Current (DC) voltage to the inputs of the capacitive structures in the one kerf circuit; and
measuring current into the capacitive structures.

26. The method of claim 23 further comprising the steps of:
discharging the capacitive structures in the one kerf circuits by setting the at least one clock signal to a second predetermined value; and
iterating the steps of charging, measuring, and discharging a predetermined number of times.

27. A method for testing capacitance, the method comprising the steps of:
providing at least one kerf circuit, each kerf circuit of the at least one kerf circuit comprising:
at least one clock circuit, the at least one clock circuit producing at least one clock signal, wherein the at least one clock signal comprises first and second clock signals; and
at least one capacitance testing circuit coupled and responsive to the at least one clock signal, each of the capacitance testing circuits comprising at least one capacitive structure;
charging the capacitive structures in one of the kerf circuits by setting the at least one clock signal to a predetermined value, by setting the first clock signal to a first predetermined value and by setting the second clock signal to a second predetermined value;
measuring capacitance of the capacitive structures in the one kerf circuit by measuring current flowing into each of the capacitive structures; and
charging the capacitive structures in the one kerf circuit by setting the first clock signal to a third predetermined value and by setting the second clock signal to a fourth predetermined value.

28. The method of claim 27 wherein each of the at least one capacitive structures comprises a reference and a test capacitive structure, and wherein each of the at least one capacitance testing circuits comprises:

a reference leg comprising the reference capacitive structure and first and second switches, the first switch responsive to the first clock signal to charge the reference capacitive structure, and the second switch responsive to the second clock signal to discharge the reference capacitive structure; and a test leg comprising a test capacitive structure and third and fourth switches, the third switch responsive to the first clock signal to charge the test capacitive structure, and the fourth switch responsive to the second clock signal to discharge the test capacitive structure; and wherein reference and test pads are provided for each of the capacitance testing circuits, each reference pad coupled to an input of the first switch of one of the capacitance testing circuits and suitable to receive a Direct Current (DC) voltage, each test pad coupled to an input of the third switch of one of the capacitance testing circuits and suitable to receive the DC voltage.

29. A method for testing capacitance, the method comprising the steps of:

providing at least one kerf circuit, each kerf circuit of the at least one kerf circuit comprising:
  at least one clock circuit, the at least one clock circuit producing at least one clock signal; and
  at least one capacitance testing circuit coupled and responsive to the at least one clock signal, each of the capacitance testing circuits comprising at least one capacitive structure;

applying a first Direct Current (DC) voltage to inputs of the capacitive structures in the at least one kerf circuit;

charging the capacitive structures in one of the kerf circuits by setting the at least one clock signal to a predetermined value for a first time period; and measuring capacitance of the capacitive structures in the at least one kerf circuit by measuring current flowing into each of the capacitive structures, by the further steps of:
  discharging the capacitive structures in the at least one kerf circuit by setting the at least one clock signal to a second predetermined value for the first time period;
  charging the capacitive structures in the at least one kerf circuit by setting the at least one clock signal to a predetermined value for a second time period, wherein the second and first time periods are different; and
  measuring current flowing into the capacitive structures.

* * * * *